(12) United States Patent
Kinsley

(10) Patent No.: US 10,453,820 B2
(45) Date of Patent: Oct. 22, 2019

(54) SEMICONDUCTOR ASSEMBLIES USING EDGE STACKING AND METHODS OF MANUFACTURING THE SAME

(71) Applicant: Micron Technology, Inc., Boise, ID (US)

(72) Inventor: Thomas H. Kinsley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/891,199

(22) Filed: Feb. 7, 2018

(65) Prior Publication Data

US 2019/0244929 A1   Aug. 8, 2019

(51) Int. Cl.
*H01L 25/18* (2006.01)
*H01L 25/065* (2006.01)
(Continued)

(52) U.S. Cl.
CPC ...... *H01L 25/0652* (2013.01); *H01L 23/3128* (2013.01); *H01L 23/49816* (2013.01);
(Continued)

(58) Field of Classification Search
CPC ..... H01L 25/0652; H01L 24/16; H01L 24/43; H01L 24/73; H01L 24/13; H01L 24/49;
(Continued)

(56) References Cited

U.S. PATENT DOCUMENTS

2003/0104652 A1\*  6/2003  LeBonheur .......... H01L 21/563
                                                                438/108
2008/0174000 A1   7/2008  Chen et al.
(Continued)

FOREIGN PATENT DOCUMENTS

JP      2002-368348     \* 12/2002
JP      2008-78164      \*  4/2008
(Continued)

OTHER PUBLICATIONS

International Application No. PCT/US2018/063657—International Search Report and Written Opinion, dated Apr. 5, 2019, 16 pages.
(Continued)

*Primary Examiner* — Ahmed N Sefer
(74) *Attorney, Agent, or Firm* — Perkins Coie LLP

(57) ABSTRACT

Semiconductor assemblies using edge stacking and associated systems and methods are disclosed herein. In some embodiments, the semiconductor assemblies comprise stacked semiconductor packages including a base substrate having a base surface, a side substrate having a side surface orthogonal to the base surface, and a die stack disposed over the base surface and having an outermost die with an outermost surface orthogonal to the side surface. The side substrate can be electrically coupled to the die stack via a plurality of interconnects extending from the side surface of the side substrate to the first surface of the first substrate or the third surface of the outermost die. The semiconductor packages can further comprise a conductive material at an outer surface of the side substrate, thereby allowing the semiconductor packages to be electrically coupled to neighboring semiconductor packages via the conductive material.

14 Claims, 11 Drawing Sheets

(51) Int. Cl.
*H01L 23/498* (2006.01)
*H01L 23/31* (2006.01)
*H01L 23/00* (2006.01)
*H01L 23/522* (2006.01)

(52) U.S. Cl.
CPC .......... *H01L 23/5226* (2013.01); *H01L 24/13* (2013.01); *H01L 24/16* (2013.01); *H01L 24/43* (2013.01); *H01L 24/49* (2013.01); *H01L 24/73* (2013.01)

(58) Field of Classification Search
CPC ............. H01L 23/5226; H01L 23/3128; H01L 2/49816
See application file for complete search history.

(56) References Cited

U.S. PATENT DOCUMENTS

2013/0127070 A1* 5/2013 Jung ................. H01L 23/13
257/777

2014/0084445 A1 3/2014 Lin et al.
2017/0170156 A1* 6/2017 Hong ................ H01L 23/49816
2017/0294401 A1 10/2017 Suthiwongsunthorn et al.

FOREIGN PATENT DOCUMENTS

| | | |
|---|---|---|
| KR | 19990038709 A | 6/1999 |
| KR | 100743649 B1 | 7/2007 |
| KR | 20090096181 A | 9/2009 |
| KR | 20100040151 A | 4/2010 |
| KR | 20110012675 A | 2/2011 |
| TW | 479337 B | 3/2002 |
| TW | 201601259 A | 1/2016 |
| TW | 201606886 A | 2/2016 |

OTHER PUBLICATIONS

TW Patent Application No. 107145865—Taiwanese Office Action and Search Report, dated Jun. 28, 2019, with English Translation, 19 pages.

* cited by examiner

SEMICONDUCTOR ASSEMBLIES USING EDGE STACKING AND METHODS OF MANUFACTURING THE SAME

TECHNICAL FIELD

The present technology is directed to packaging semiconductor devices, such as memory and processors, and several embodiments are directed to semiconductor assemblies that use modular edge stacking.

BACKGROUND

Packaged semiconductor dies, including memory dies, microprocessor dies, and interface dies, typically include a semiconductor die mounted on a substrate and encased in a plastic protective covering. The die includes functional features, such as memory cells, processor circuits, and interconnecting circuitry, as well as bond pads electrically connected to the functional features. The bond pads are often electrically connected to external terminals that extend outside of the protective covering to allow the die to be connected to busses, circuits or other higher level circuitry.

Semiconductor die manufacturers are under increasing pressure to continually reduce the size of die packages to fit within the space constraints of electronic devices, while also increasing the functional capacity of each package to meet operating parameters. One approach for increasing the processing power of a semiconductor package without substantially increasing the surface area covered by the package (i.e., the package's "footprint") is to vertically stack multiple semiconductor dies on top of one another in a single package. Stacking multiple dies, however, increases the vertical profile of the device, requiring the individual dies to be thinned substantially to achieve a vertically compact size. Additionally, the stacking of multiple dies can increase the probability of device failure, and lead to higher costs associated with longer manufacturing and testing times.

FIG. 1 illustrates a conventional system 10 including multiple semiconductor stacked assemblies. As shown, the system 10 includes printed circuit boards (PCBs) 15 arranged in dual in-line memory module (DIMM) slots and separated from one another by a given center-line to center-line pitch (i.e., ~7.6 mm). Semiconductor packages 12 are attached to each of the PCBs 15 in a stacked arrangement. Specifically, bottom portions of each semiconductor package 12 are attached via solder balls 13 to opposite sides of the PCBs 15. The conventional system 10 has limited space between the semiconductor packages 12 (i.e, 1 mm) on adjacent DIMM slots, which can limit airflow therebetween required for thermal control and restrict the performance of the packages. Accordingly, there is a need for other approaches to providing semiconductor devices with smaller footprints, while still maintaining sufficient functional capacity to meet operating parameters.

DETAILED DESCRIPTION

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with semiconductor devices are not shown, or are not described in detail, to avoid obscuring other aspects of the technology. In general, it should be understood that various other devices, systems, and methods in addition to those specific embodiments disclosed herein may be within the scope of the present technology.

As discussed above, semiconductor packages are continually designed to have smaller footprints, while also maintaining sufficient processing power. Accordingly, several embodiments of semiconductor packages in accordance with the present technology can be electrically coupled to one another with modular edge stacking techniques to form high density modules. In some embodiments, each semiconductor package comprises a first substrate having a first surface, a second substrate having a second surface orthogonal to the first surface, and one or more dies disposed over the first surface of the first substrate. The semiconductor package further comprises one or more interconnections extending from the second surface of the second substrate to at least one of (a) the first surface of the first substrate, or (b) an outermost surface of the one or more dies. The semiconductor packages can be electrically coupled to neighboring semiconductor packages via external connection sites at outer surfaces (e.g., edges) of the first and/or second substrates.

Figure 1:
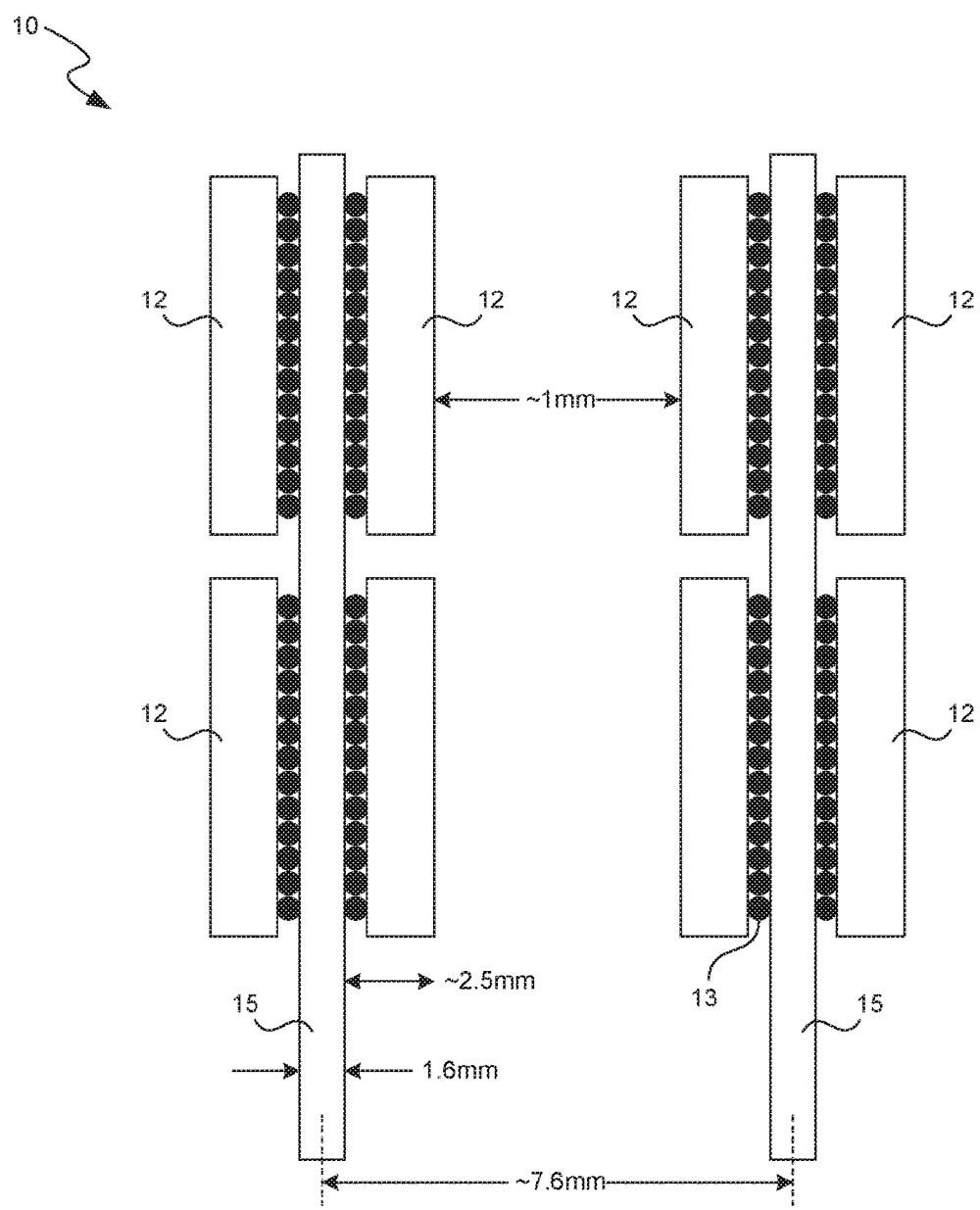
FIG. 1 is a schematic side view of a semiconductor device assembly in accordance with the prior art.
Figure 2A:
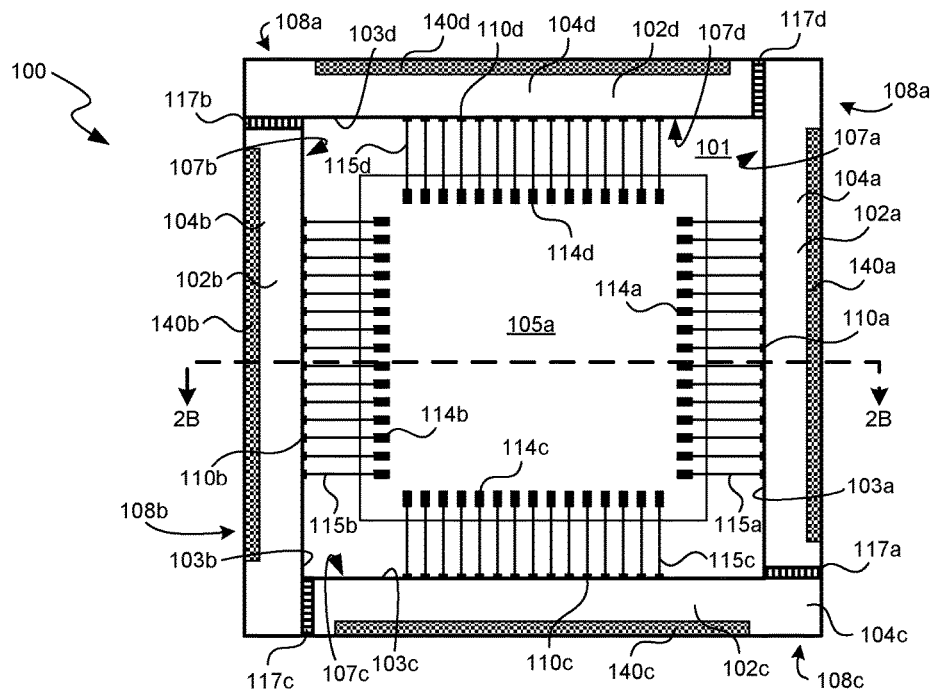
FIG. 2A is a schematic top view of a semiconductor device package taken along line 2A-2A of FIG. 2B, and configured in accordance with embodiments of the present technology.
Figure 2B:
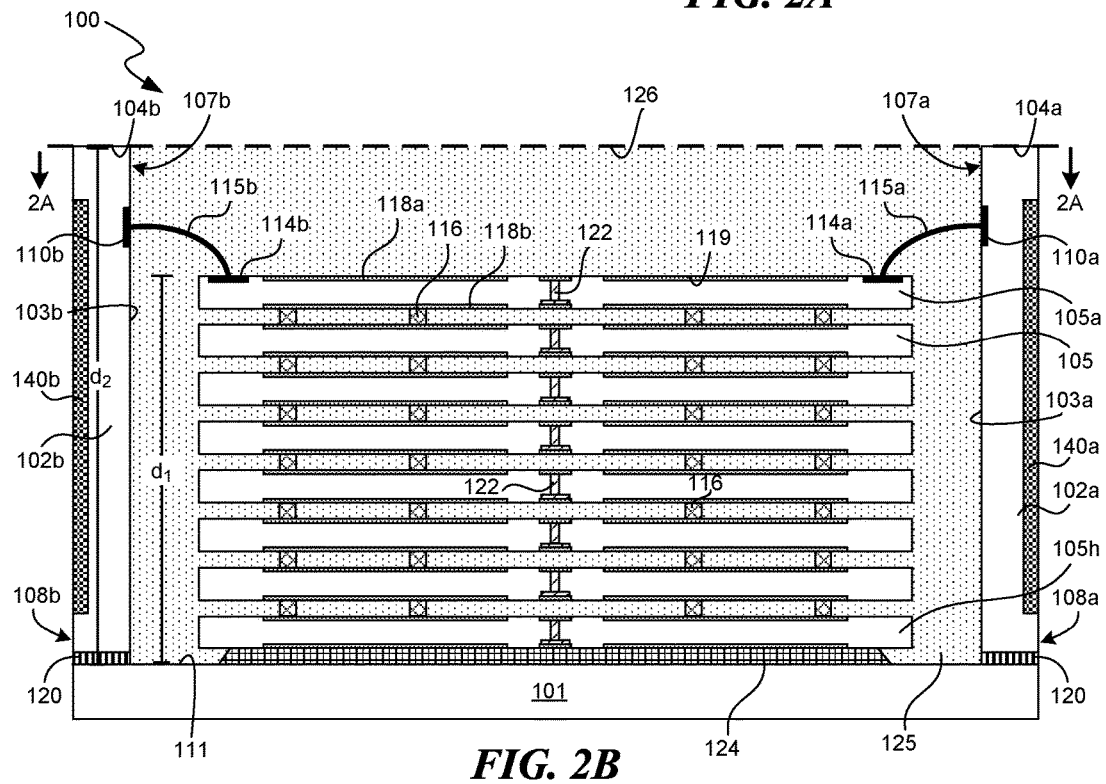
FIG. 2B is a schematic cross-sectional view of the semiconductor device package shown in FIG. 2A taken along line 2B-2B of FIG. 2A, and configured in accordance with embodiments of the present technology.

FIGS. 2A is a schematic top view of a semiconductor device package 100 ("package 100") taken along line 2A-2A of FIG. 2B, and FIG. 2B is a schematic cross-sectional view of the semiconductor device assembly 100 taken along line 2B-2B of FIG. 2A. Referring to FIGS. 2A and 2B together, the package 100 includes a base substrate 101 having a base surface 111, a stack of dies 105a (collectively "die stack 105") disposed over the base surface 111, and one or more side substrates 102a-d also disposed over the base surface 111. The base substrate 101 and side substrates 102a-d can include redistribution structures, interposers, dielectric spacers, additional semiconductor dies (e.g., a logic die), or other suitable substrates. Each side substrate 102a-d can include a first end portion (e.g., a bottom portion) attached to the base substrate 101 via a first bonding material 120 (e.g., an adhesive paste, an adhesive element, or die-attach tape/film), and a second end portion (e.g., a side portion) attached to a neighboring side substrate via a second bonding material 117a-d (e.g., an adhesive paste, an adhesive element, or die-attach tape/film). The side substrates 102a-d can at least partially surround and form an enclosure around the die stack 105. An outermost die 105a of the die stack 105 can include an outermost surface 119 facing a direction generally away from the base surface 111. The die stack 105 can be attached to the base surface 111 of the base substrate 101 via an underfill material 124 (e.g., an adhesive paste, or an adhesive element). In some embodiments, the die stack 105 can be electrically coupled to the base substrate 101 via circuitry.

Each of the side substrates 102a-d extends vertically away from the base surface 111 of the base substrate 101, and includes (a) a respective first side 107a-d facing the die stack 105 and having a respective side surface 103a-d, (b) a respective second side 108a-d opposite the first side, and (c) a respective outermost edge 104a-d. For example, the side substrate 102a includes a first side 107a having a side surface 103a, a second side 108a opposite the first side 107a, and an outermost edge 104a. In such an embodiment, each of the side surfaces 103a-d of the side substrates 102a-d, respectively, is generally orthogonal to (a) the outermost surface 119 of the die stack 105, and (b) the base surface 111 of the base substrate 101. As shown in FIG. 2B, the die stack 105 may be separated from the base surface 111 by a first distance ($d_1$) and the outermost edges 104a-d may be separated by a second distance ($d_2$) greater than the first distance ($d_1$).

Each of the side substrates 102a-d can be electrically coupled directly to the die stack 105 via a plurality of interconnections 115a-d (e.g., wirebonds or conductive materials) extending from respective bond pads 110a-d on the respective side surfaces 103a-d of the respective side substrates 102a-d to respective bond pads 114a-d on the outermost surface 119 of the outermost die 105a. For example, a plurality of wirebonds 115a can extend from bond pads 110a on the side surface 103a to bond pads 114a on the outermost surface 119 of the outermost die 105a. In such embodiments, the die stack 105 is electrically coupled to the side substrates 102a-d and the base substrate 101. The second sides 108a-d of the respective side substrates 102a-d can each include respective conductive materials 140a-d, which can include a pad (e.g., a contact pad), as shown in FIGS. 2A and 2B, or an array of conductive materials (e.g., an array of contacts or a ball grid array). The conductive materials 140a-d can be electrically coupled via circuitry to the respective bond pads 110a-d at the respective first sides 107a-d of the respective side substrates 102a-d, and thus can electrically couple the die stack 105 and/or the base substrate 101 to external packages.

The individual semiconductor dies 105a-h can include one or more through-substrate vias 122 (TSVs) extending at least partially through the dies 105a-h, and conductive traces 118a-b over outermost surfaces of the semiconductor dies 105a-h. The individual semiconductor dies 105a-h can be electrically coupled to neighboring dies via one or more interconnects 116. The semiconductor dies 105a-h can include integrated circuitry or components, data storage elements, processing components, and/or other features manufactured on semiconductor substrates. For example, the semiconductor dies 105a-h can include integrated memory circuitry and/or logic circuitry, which can include various types of semiconductor components and functional features, such as dynamic random-access memory (DRAM), static random-access memory (SRAM), flash memory, other forms of integrated circuit memory, processing circuits, imaging components, and/or other semiconductor features. In some embodiments, the semiconductor dies 105a-h can be identical (e.g., memory dies manufactured to have the same design and specifications), but in other embodiments the semiconductor dies 105a-h can be different from each other (e.g., different types of memory dies or a combination of controller, logic, and/or memory dies).

The conductive materials 140a-d can be formed from one or more of copper, nickel, solder (e.g., SnAg-based solder, solder balls), conductor-filled epoxy, and/or other electrically conductive materials. As shown in FIGS. 2A and 2B, the conductive material 140a-d can cover a majority of the surface area at the second sides 108a-d of the side substrates 102a-d, and can be formed to have a similar or complimentary arrangement to corresponding conductive materials on other packages. In some embodiments, the side substrates 102a-d and respective conductive materials 140a-d positioned thereon may be homogeneous (i.e., identical), which can help ensure a package 100 can be electrically coupled to a neighboring package 100. While the embodiment shown in FIGS. 2A and 2B includes a layer of conductive material, in some embodiments, the conductive materials 140a-d can comprise a ball grid array or other arrangement.

The package 100 can further include a mold or molded material 125 over the base substrate 101 and die stack 105. The mold material 125 may be formed from a resin, epoxy resin, silicone-based material, polyimide, and/or other suitable resin used or known in the art. As shown in FIGS. 2A and 2B, the mold material 125 can be formed within the enclosure defined by the side substrates 102a-d, and can at least partially contact the die stack 105, the side substrates 102a-d, the base substrate 101, and the plurality of wirebonds 115a-d, thereby encapsulating (e.g., sealing) and protecting one or more of these components from contaminants and/or physical damage. The mold material 125 can include an outermost surface 126 that is generally co-planar to the outermost edges 104a-d of the respective side substrates 102a-d such that the outermost edges 104a-d are not covered by the mold material 125. In some embodiments, the outermost surface 126 of the mold material 125 can be slightly above the outermost edges 104a-d such that the outermost surface 126 of the mold material 125 extends over and covers the outermost edges 104a-d. Furthermore, in some embodiments, the mold material 125 may extend over the second sides 108a-d of the respective side substrates 102a-d such that at least a portion of the external surfaces at the second sides 108a-d are covered. In such embodiments, the conductive materials 140a-d can be exposed through the mold material 125 to remain operable to electrically couple the package 100 to external connection sites and packages.

Figure 3A:
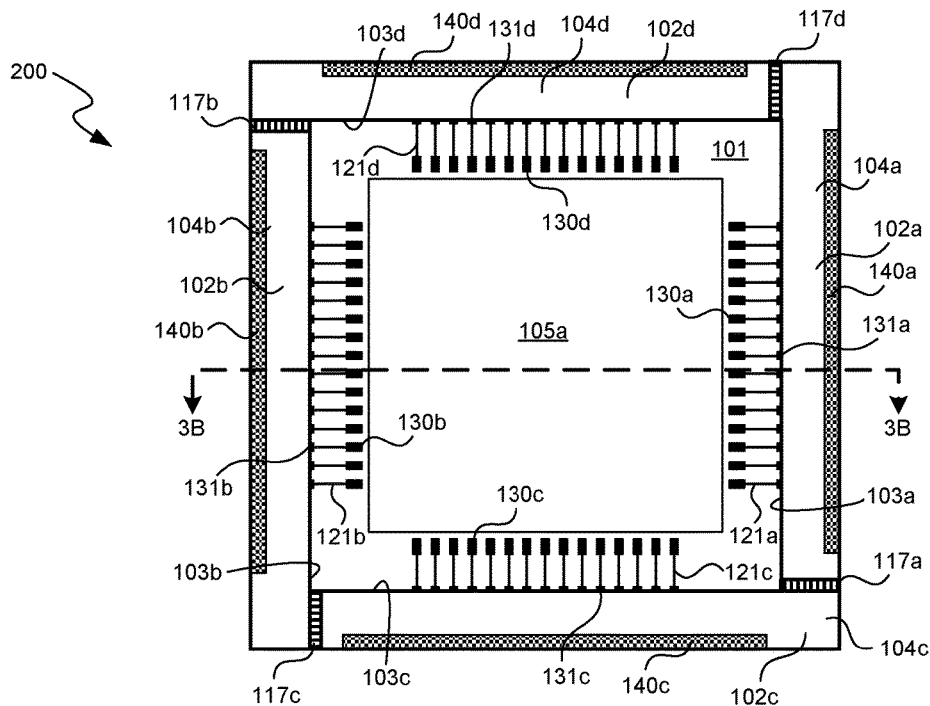
FIG. 3A is a schematic top view of a semiconductor device package taken along line 3A-3A of FIG. 3B, and configured in accordance with embodiments of the present technology.
Figure 3B:
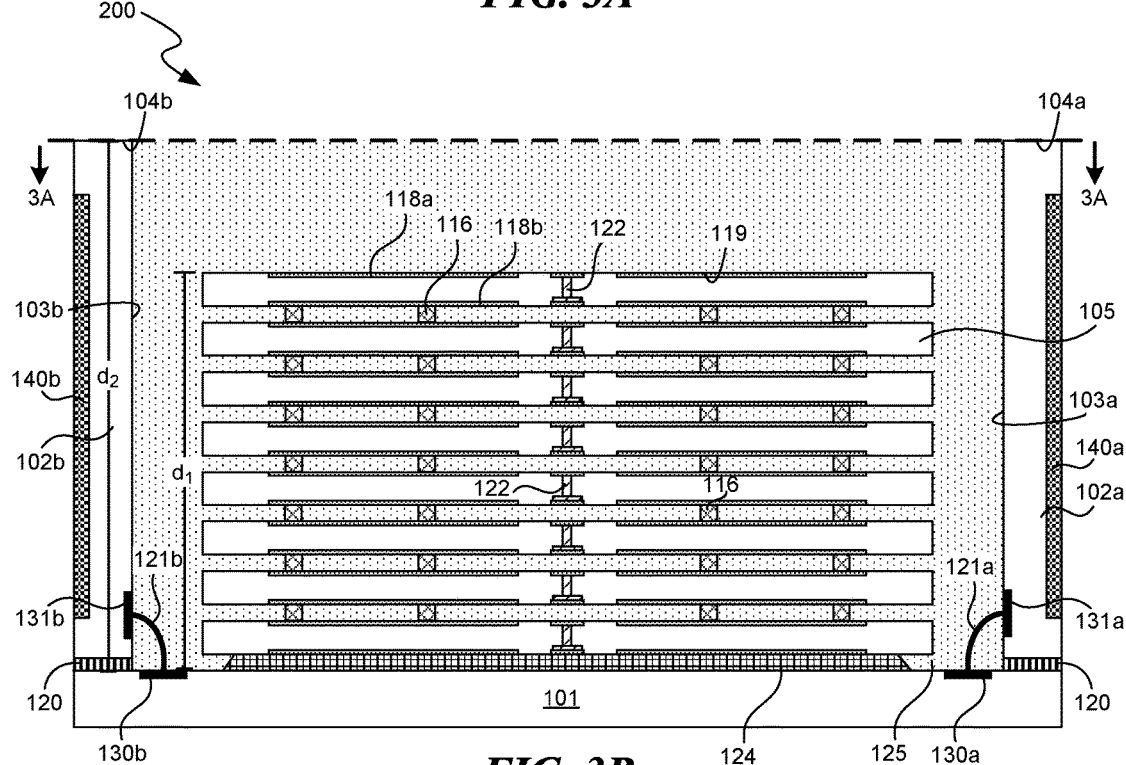
FIG. 3B is a schematic cross-sectional view of the semiconductor device package shown in FIG. 3A taken along line 3B-3B of FIG. 3A, and configured in accordance with embodiments of the present technology.

FIGS. 3A is a schematic top view of a semiconductor device package 200 ("package 200") taken along line 3A-3A of FIG. 3B, and FIG. 3B is a schematic cross-sectional view of the package 200 taken along line 3B-3B of FIG. 3A. Package 200 includes similar features to that of package 100 shown in FIGS. 2A and 2B, except that in FIGS. 3A and 3B, the side substrates 102a-d are electrically coupled directly to the base substrate 101. Specifically, each of the side substrates 102a-d can be electrically coupled directly to base substrate 101 via a plurality of respective interconnections 121a-d extending from the bond pads 131a-d on the respective side surfaces 103a-d of the respective side substrates 102a-d to respective bond pads 130a-d on the base surface 111 of the base substrate 101. In such embodiments, the side substrates 102a-d can be electrically coupled directly to the base substrate 101, and electrically coupled indirectly to the die stack 105 via the base substrate 101.

Although FIGS. 2A-3B include four side substrates (e.g., 102a-d) disposed over the base substrate 101 to form an enclosure, in some embodiments, less than four side substrates may be included. For example, the package 100 may include only a single side substrate (e.g., side substrate 102a), two side substrates (e.g., side substrates 102a, b or 102a, c), or three side substrates (e.g., side substrates 102a, b, c). In such embodiments, the molded material 125 may form one or more side surfaces of the package 100 or 200.

Figure 4A:
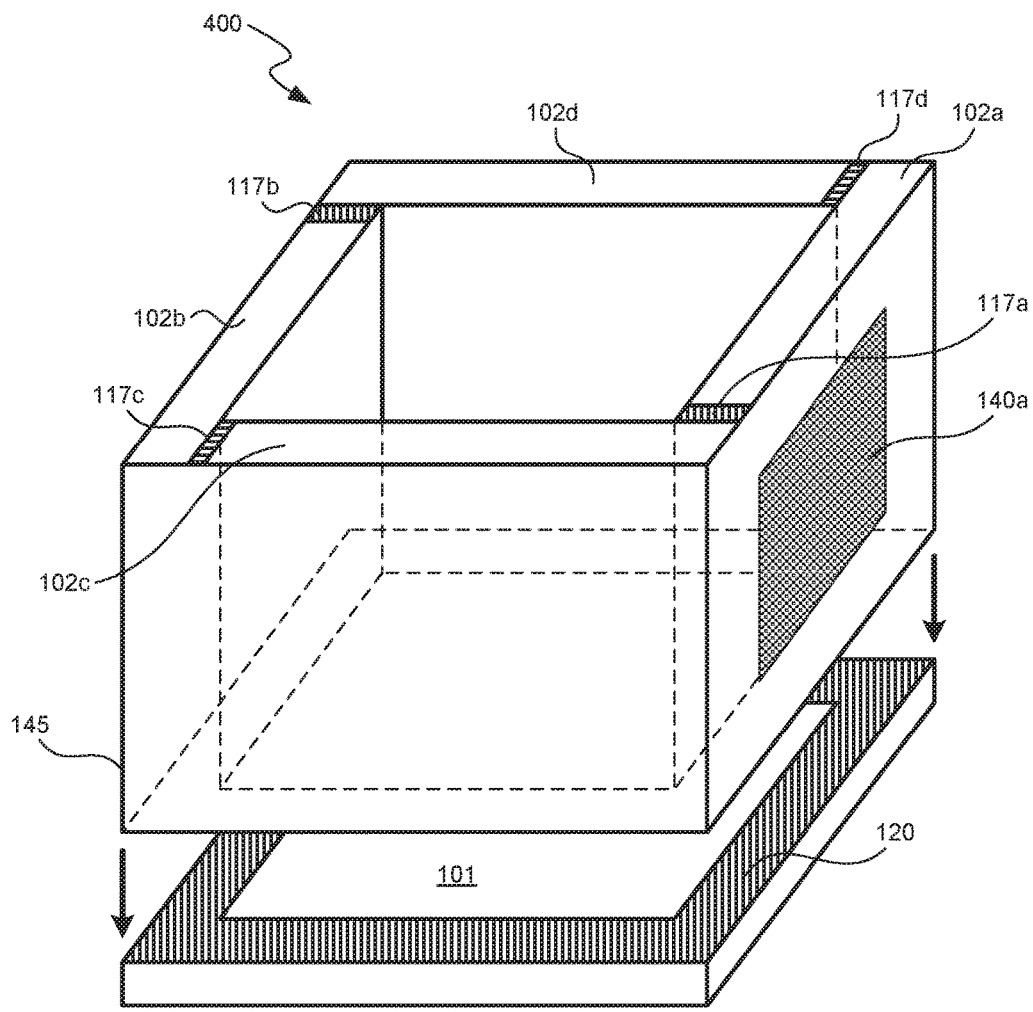
FIGS. 4A-4D are schematic views illustrating a method of forming a semiconductor device package configured in accordance with embodiments of the present technology.

FIGS. 4A-4D are schematic views illustrating a method of forming a semiconductor device package ("package 400") configured in accordance with an embodiment of the present technology. Referring first to FIG. 4A, the method can include attaching one or more of the side substrates 102a-d to one another via the second bonding materials 117a-d to form a side substrate assembly 145 with an opening therethrough. The second bonding materials 117a-d can extend over substantially the entire end portion of the corresponding side substrate, or less than the entire end portion of the corresponding side substrate. As shown in FIG. 4A, each side substrate overlaps with a portion of the side substrate attached thereto. In other embodiments, the side substrates 102a-d may be attached to one another in a way such that there is no overlap. Each side substrate 102a-d can be homogenous or identical to the other side substrates 102a-d, or can have different dimensions, depending on the target footprint and/or application desired for the package. FIG. 4A further shows the side substrate assembly 145 being attached to the base substrate 101 via the first bonding material 120. The first bonding material 120 can be formed substantially over the entire base surface 111 of the base substrate 101, or over just a portion of the base surface 111.

Figure 4B:
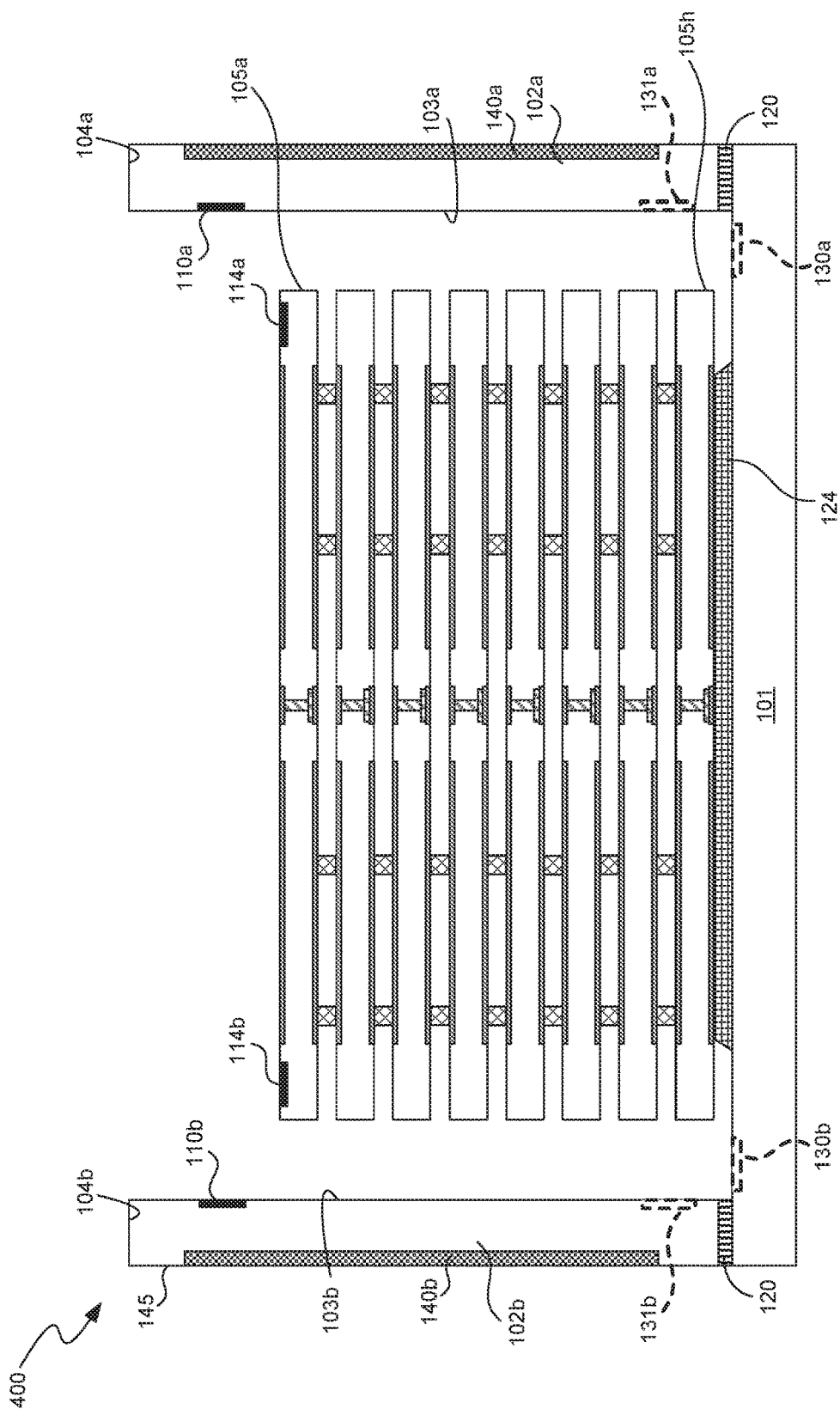

Referring next to FIG. 4B, fabrication of the package 400 continues by disposing the die stack 105 over the base substrate 101 and within the enclosure defined by the side substrates 102a-d. As previously mentioned with reference to FIG. 2A-3B, the die stack 105 can be attached to the base substrate 101 via the underfill material 124. The die stack 105 can be formed as a discrete package prior to being attached to the base substrate 101, or the die stack 105 can be formed by sequentially stacking individual dies 105a-h within the enclosure. In some embodiments, disposing the die stack 105 over the base substrate 101 can occur after forming the side substrate assembly 145.

Figure 4C:
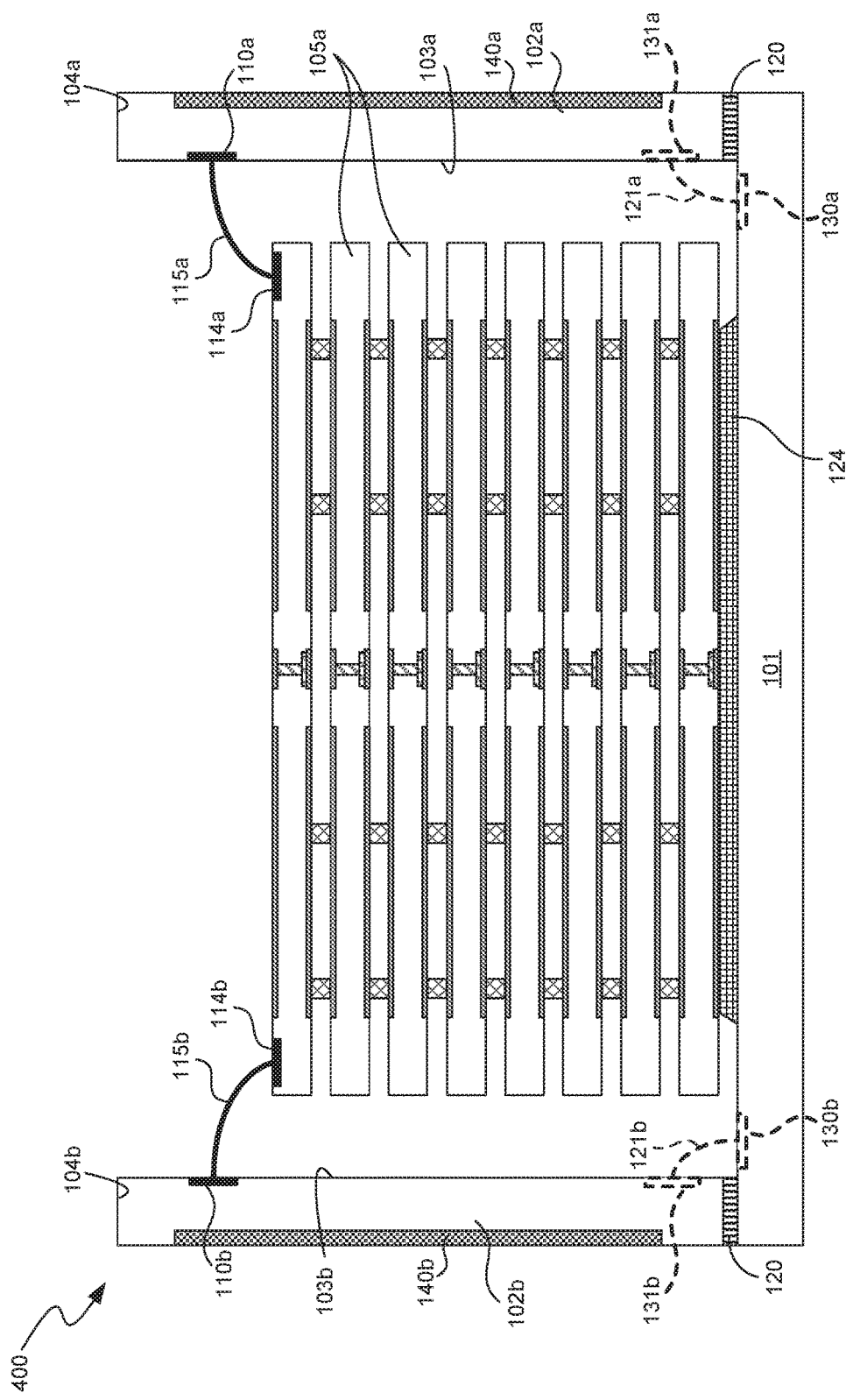

FIG. 4C shows the package 400 after the die stack 105 is electrically coupled to one or more of the side substrates 102a-d via interconnects 115a-d that extend from the bond pads 114a-d on the outermost die 105a of the die stack 105 to the respective bond pads 110a-d on the respective side substrates 102a-d. As previously mentioned, electrically coupling the side substrates 102a-d to the die stack 105 can also indirectly electrically couple the side substrates 102a-d to the base substrate 101. For illustrative convenience, FIG. 4C optionally includes another plurality of interconnects 121a-d (only 121a and 121b are shown) electrically coupling the side substrates 102a-d to the base substrate 101. In a preferred embodiment, the package 400 would include either the interconnects 115a-d or the interconnects 121a-d, but not both.

Figure 4D:
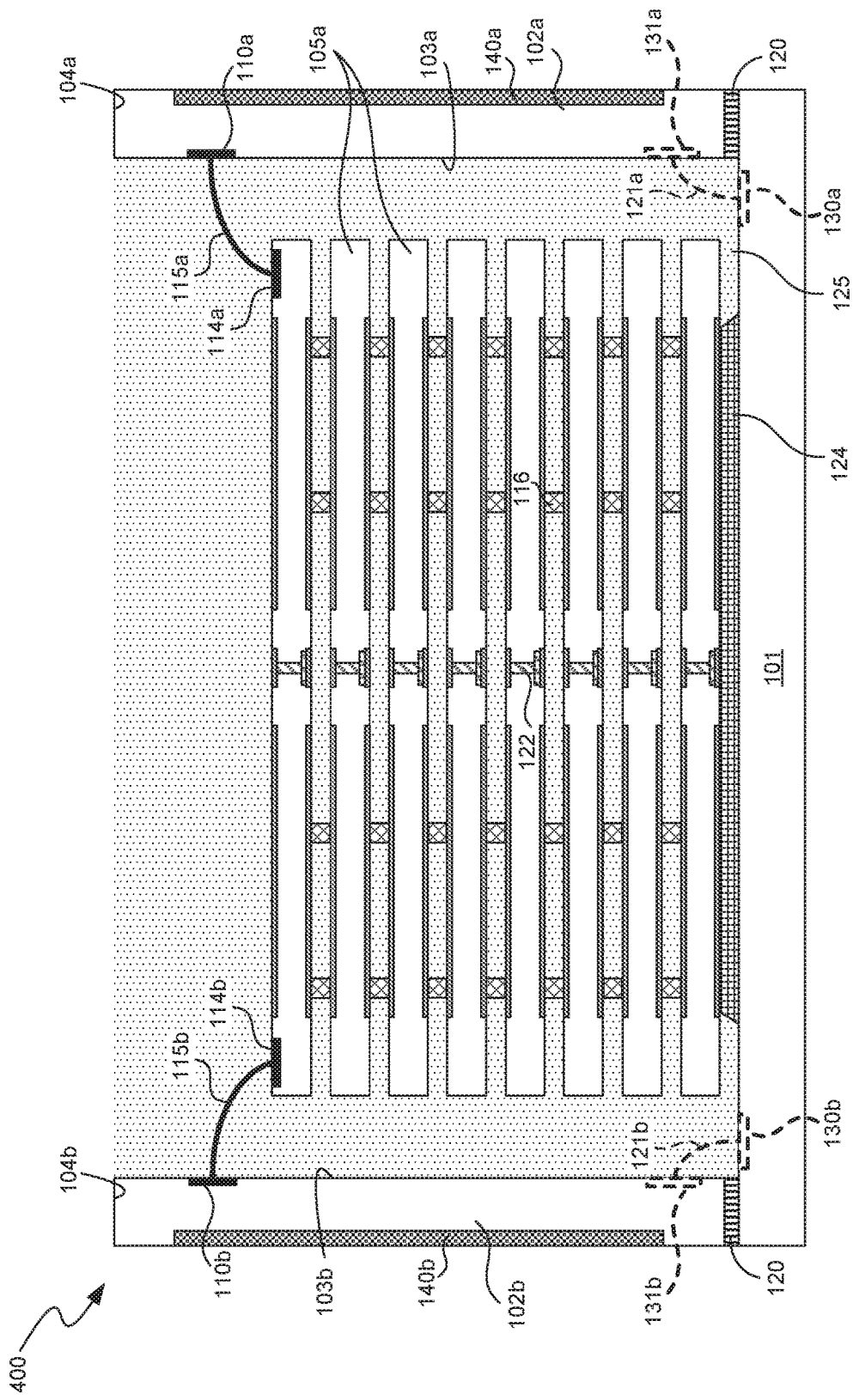

FIG. 4D shows the package 400 after disposing the mold material 125 on the base surface 111 of the base substrate 101, with the mold material 125 being in contact with portions of the die stack 105, interconnects 115a-d (or interconnects 121a-d), and side substrates 102a-d. Once deposited, the mold material 125 can be cured by UV light, chemical hardeners, heat, or other suitable curing methods used or known in the art.

Figure 5:
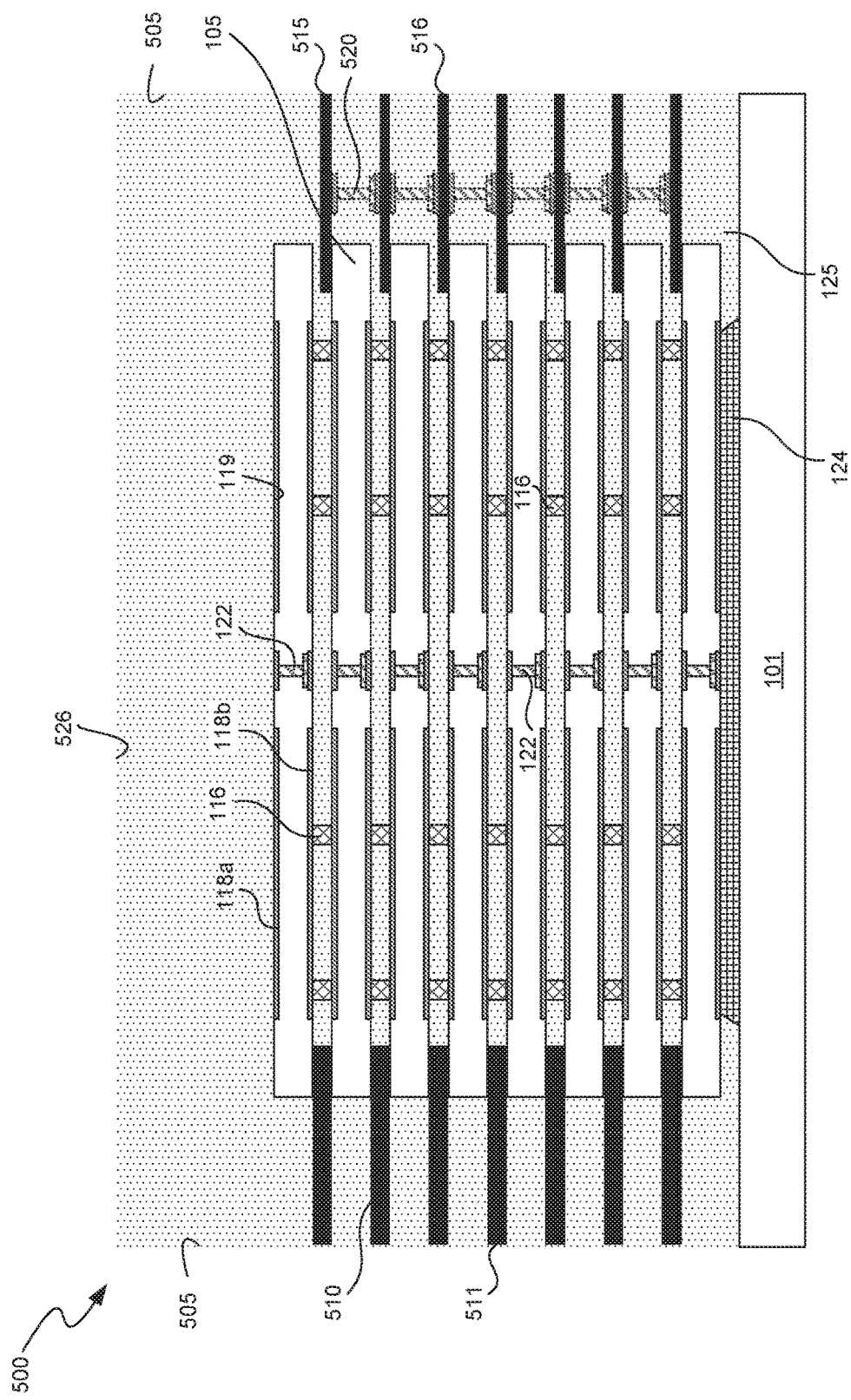
FIG. 5 is a schematic cross-sectional view of a semiconductor device package configured in accordance with embodiments of the present technology.

FIG. 5 is a schematic cross-sectional view of a semiconductor device package 500 ("package 500") configured in accordance with embodiments of the present technology. The package 500 includes features generally similar to those of packages 100 and 200 previously described. For example, package 500 includes a base substrate 101, a die stack 105 attached to the base substrate via an underfill material 124, and a mold material 125 encapsulating at least a portion of the die stack 105 and base substrate 101. Notably, in this embodiment, the package 500 does not include side substrates (e.g., 102a-d). As such, the mold material 125 can form an outermost edge 505 and an outermost surface 526. The package 500 further includes a plurality of conductive layers formed at least partially between individual, neighboring dies 105a-h of the die stack 105. In some embodiments, as shown on the left side of the package 500, the conductive layers can comprise conductive fingers 510 positioned over individual dies 105a-h such that the individual, neighboring dies 105a-h are separated from one another by the conductive fingers 510. The conductive fingers 510 can extend horizontally from the die stack 105 through the mold material 125, such that end portion 511 of the conductive fingers 510 are exposed at the outermost edge 505. The end portions 511 of the conductive fingers 510 can be electrically coupled to external connection sites. In other embodiments, as shown on the right side of the package 500, the conductive layers can comprise conductive fingers 515 positioned over individual dies 105a-h and extending horizontally from the die stack 105 through the mold material 125, such that an end portion 516 of the conductive fingers 515 is exposed through the side surface 505a. The end portions 516 of the conductive fingers 515 can be electrically coupled to external connection sites. The individual, neighboring dies can be electrically coupled to one another via interconnects 520 extending vertically through the mold material 125 and from a first semiconductor die (individual die 105a) to a neighboring semiconductor die (e.g., individual die 105b). In the embodiments shown in FIG. 5, the package 500 does not include wirebonds. In other embodiments, however, the package 500 can include wirebonds extending, for example, from the die stack 105 and/or individual dies 105a-h to an external package.

Figures 6A, 6B, 6C:
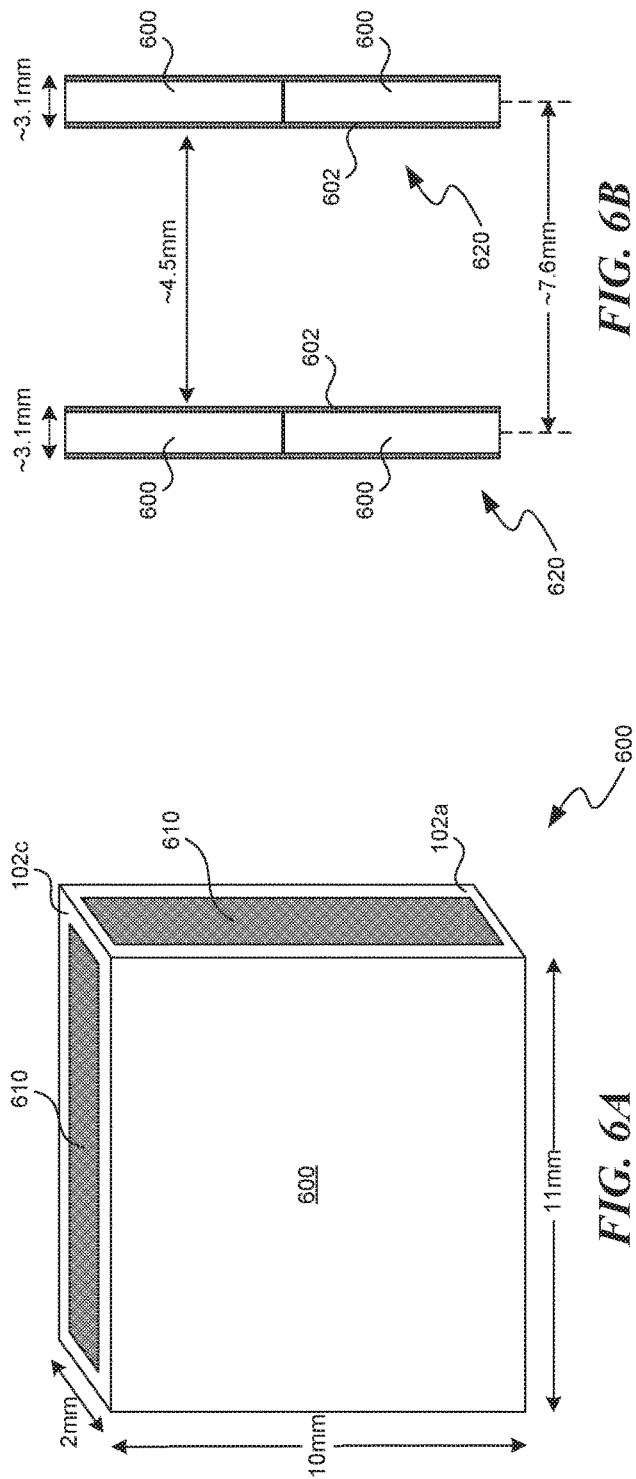
FIGS. 6A-6C and 7A-7D are schematic views of semiconductor device assemblies configured in accordance with embodiments of the present technology.

FIGS. 6A-6C are schematic views of semiconductor device packages and assemblies. More specifically, FIG. 6A corresponds to an individual semiconductor package 600 ("package 600") formed in accordance with those embodiments previously described (e.g., packages 100, 200 and/or 500), FIG. 6B corresponds to multiple semiconductor device assemblies 620 ("assembly 620") of packages 600 arranged in a stacked, modular configuration in DIMM slots and FIG. 6C corresponds to a semiconductor device assembly ("assembly 640") of packages 600 arranged in a stacked, modular configuration. The present technology is not meant to be limited to the embodiments and details (e.g., the dimensions) shown in FIGS. 6A-6C. Rather, these embodiments and details are meant to merely further the understanding of the present technology to a person of ordinary skill in the relevant art.

As shown in FIG. 6A, the package 600 includes the base substrate 101 attached to one or more of the side substrates 102a-d, with the side substrates 102a-d each including a conductive material 610(e.g., conductive materials 140a-d or conductive fingers 510, 515) on an outer surface of the side substrates 102a-d. In the embodiment shown in FIG. 6A, the package 600 includes a height of 10 mm, a width of 11 mm, and a thickness of 2 mm. Other embodiments, however, can include varying dimensions in order to form a package and/or assembly suitable for a desired application.

FIG. 6B illustrates multiple assemblies 620 of the stacked packages 600 arranged adjacent and separated from one another. The assemblies 620 can include a protective covering 602 around the assemblies 620 to protect them from physical damage. The protective coverings 602 may also serve as heat spreaders to better (e.g., more evenly) distribute heat amongst the individual packages 600. FIG. 6B helps illustrate multiple advantages of the present technology over conventional technologies. For example, in the embodiment shown, each assembly 620 is itself positionable into a DIMM slot without needing to first be attached to a PCB that is then inserted into the DIMM slot. As such, and assuming a separation of approximately 7.6 mm between adjacent slots in line with conventional technologies, the present technology can allow a greater separation between adjacent assemblies 620 (e.g., ~4.5 mm), allowing greater air flow between the assemblies 620 and thereby cooling (e.g., via convection) the assemblies 620 at a faster rate than conventional technologies. Another advantage of the present technology is the decreased time and costs associated with manufacturing the assemblies to be mounted in the DIMM slots. The present technology, for example, removes at least one manufacturing processing step from conventional methods for forming the packages (e.g., attaching the packages to a PCB prior to inserting the PCB into the DIMM slots).

FIG. 6C illustrates an assembly 640 of individual packages 600 in a different arrangement. As shown, the assembly 640 includes a 2x4 arrangement of individual pacakges 600. In other embodiments, the assembly 640 can include different arrangements (e.g. 1x3, 1x6, 3x3, 3x6, etc.) depending on the desired application.

Figure 7A:
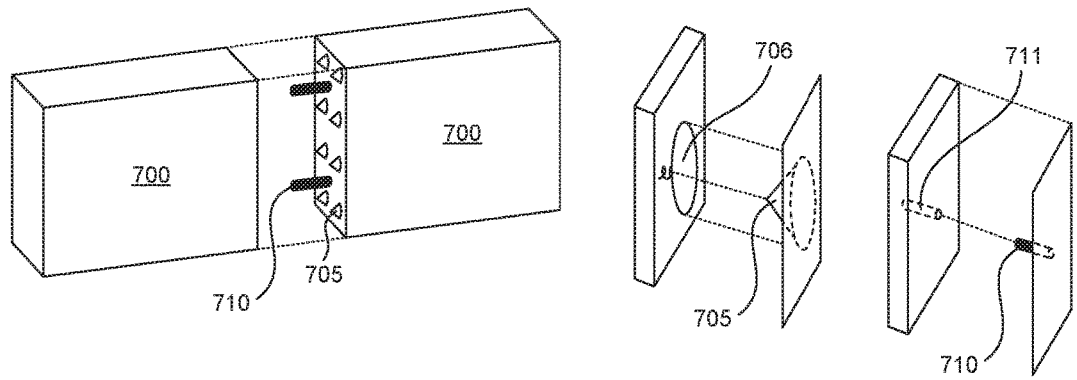
Figure 7B:
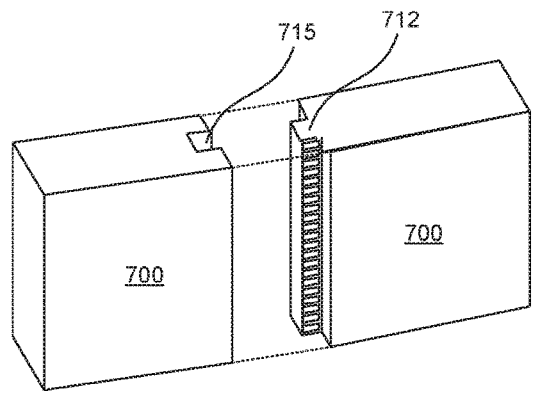
Figure 7C:
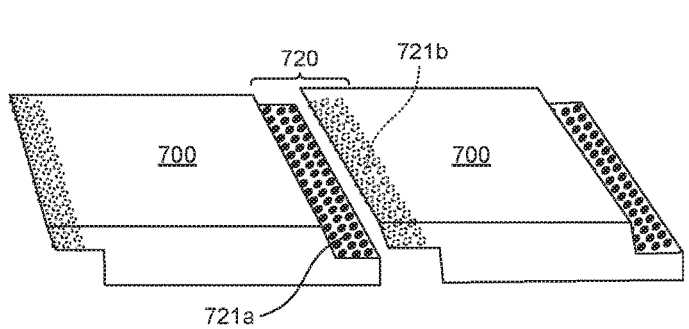

FIGS. 7A-7C illustrate schematic views of semiconductor device packages being attached and electrically coupled to one another. As previously mentioned with reference to FIGS. 2A-6, individual packages (e.g., packages 100, 200, 500 and/or 600) can include conductive materials (e.g., conductive material 140a-d or conductive fingers 510, 515) at outer surfaces of the substrates (e.g., base substrate 101 or side substrates 102a-d) of the packages. The conductive materials can electrically couple individual packages to one another. FIGS. 7A-7C show embodiments of conductive material arrangements that may be used to electrically couple individual packages to one another. As shown in FIG. 7A, a bump 705 (e.g., solder pins) and a divot 706 (e.g., pads) arrangement can be used, wherein an array of bumps 705 on a first package 700 are configured to be put into contact with corresponding divots 706 on a second package 700. The bumps 705 and divots 706 can each protrude from outer surfaces of the packages and create an electrical connection therebetween when the packages are moved toward one another and the bumps 705 and divots 706 contact one another. In some embodiments, the divot 706 can be mechanically coupled to a spring or spring-like element that allows any positioning offset between a bump 705 and divot 706 to be absorbed by the divot 706. Assemblies can further comprise one or more locking or alignment pins 710 and corresponding receptacles 711 that mechanically couple packages 700 to one another using a friction fit.

Figure 7D:
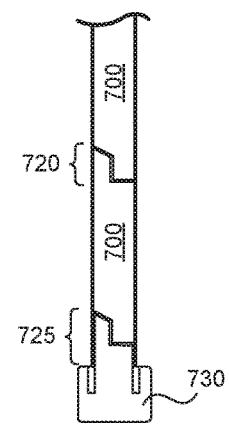

FIGS. 7B-7D include similar functionality to that described for FIG. 7A, but utilize different mechanical coupling arrangements. For example, FIG. 7B utilizes a tab 712 and slot 715 arrangement, wherein tabs on a first package are shaped such that they are complimentary to corresponding slots 715 on a second package. Conductive material exposed at portions (e.g., side portions) of the tabs 712 are positioned to be in contact with conductive material at corresponding portions of the slots 715 to create an electrical connection therebetween. In some embodiments, the conductive material exposed at the tabs 712 and slots 715 may correspond to conductive fingers 510, 515 previously described with reference to FIG. 5.

FIG. 7C utilizes yet another arrangement creating a lap joint 720 between first and second packages. In such an arrangement, an overhang portion 721b from the first package can form an electrical connection with an extending lip portion 721a from the second package. Each of the overhang portion 721b and the lip portion 721a can include a ball grid array or similar arrangement of conductive materials to ensure a robust electrical connection. In addition to joining individual packages to one another, the lap joint 720 and overhang-lip arrangement can be used to join packages to DIMM slots or sockets 730. As shown in FIG. 7D, the slot or socket 730 can comprise a joining portion 725 that compliments the lip portion 721a (or overhang portion 721b) of a package, thereby allowing the assembly of packages 700 to be directly connected to a motherboard or backplane. Once connected, the package may be further secured to the motherboard with additional latches.

Figure 8:
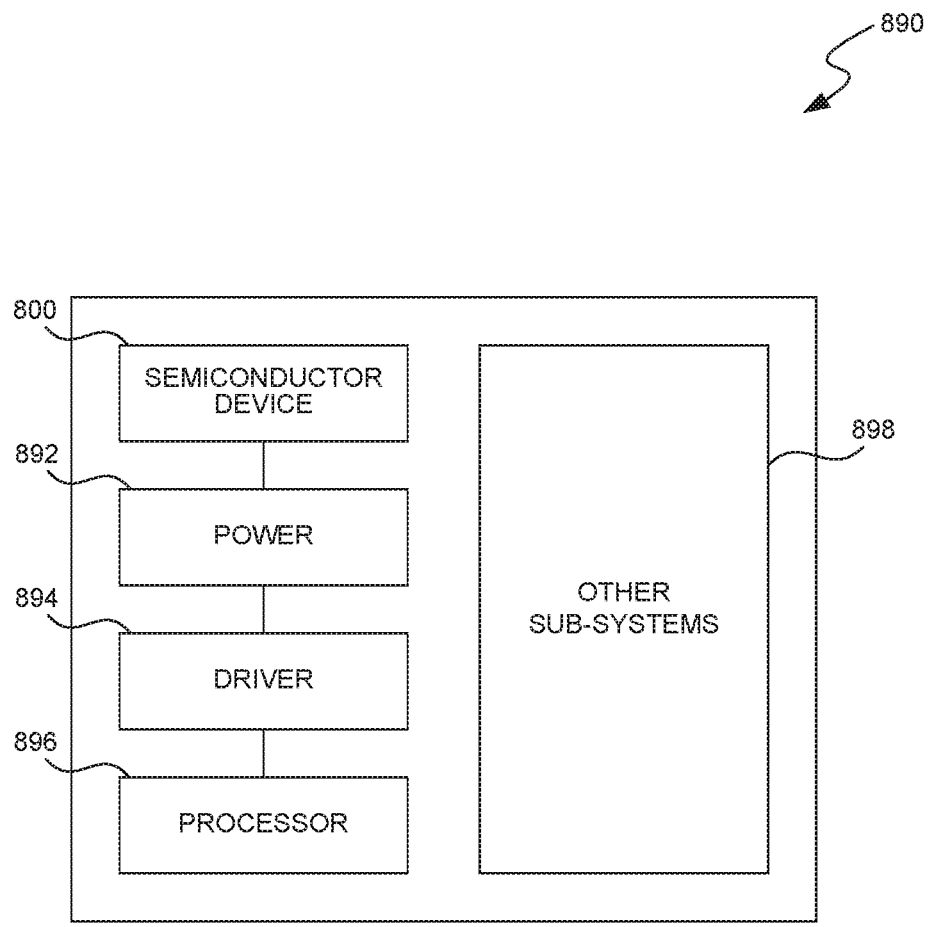
FIG. 8 is a schematic view of a system that includes a semiconductor assembly configured in accordance with embodiments of the present technology.

Any one of the semiconductor devices described above with reference to FIGS. 2A-7C can be incorporated into any of a myriad of larger and/or more complex systems, a representative example of which is system 890 shown schematically in FIG. 8. The system 890 can include a semiconductor device 800 ("device 800") (e.g., a semiconductor package or assembly), a power source 892, a driver 894, a processor 896, and/or other subsystems or components 898. The device 800 can include features generally similar to those devices described above. The resulting system 890 can perform any of a wide variety of functions, such as memory storage, data processing, and/or other suitable functions. Accordingly, representative systems 890 can include, without limitation, hand-held devices (e.g., mobile phones, tablets, digital readers, and digital audio players), computers, and appliances. Components of the system 890 may be housed in a single unit or distributed over multiple, interconnected units (e.g., through a communications network). The components of the system 890 can also include remote devices and any of a wide variety of computer readable media.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein, and the invention is not limited except as by the appended claims.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising," "including," and "having" are used throughout to mean including at least the recited feature(s) such that any greater number of the same feature and/or additional types of other features are not precluded. Reference herein to "one embodiment," "an embodiment," "some embodiments" or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

I claim:

1. A semiconductor package, comprising:
   a first substrate having a first surface, wherein the first substrate includes a plurality of first bond pads at the first surface;
   a second substrate having a second surface generally orthogonal to the first surface, wherein:
     the second substrate is rigidly attached directly to the first substrate via a bonding material, and
     the second substrate includes a plurality of second bond pads at the second surface;
   one or more dies over the first surface, wherein an outermost die of the one or more dies includes a third surface generally orthogonal to the second surface; and
   a plurality of wirebonds extending from the second surface of the second substrate to at least one of (a) the first surface of the first substrate, or (b) the third surface of the outermost die, wherein the plurality of wirebonds extend between the first bond pads and the second bond pads.

2. The semiconductor package of claim 1 wherein the second substrate includes a first side and a second side opposite the first side, wherein the second surface is at the first side, and wherein the second side includes an external connection site having an exposed conductive material configured to be electrically coupled to an external package.

3. The semiconductor package of claim 2 wherein the conductive material corresponds to an array of contacts.

4. The semiconductor package of claim 1 wherein the first substrate includes a first side and a second side opposite the first side, wherein the first surface is at the first side, and wherein the second side includes an external connection site having an exposed conductive material configured to be electrically coupled to an external package.

5. The semiconductor package of claim 1 wherein the first substrate is a base substrate and the second substrate is a side substrate attached to the base substrate and extending vertically away from the base substrate.

6. The semiconductor package of claim 1 wherein the outermost die includes a plurality of first bond pads at the third surface and the second substrate includes a plurality of second bond pads at the second surface, and wherein the wirebonds extend from the first bond pads to the second bond pads.

7. A semiconductor package, comprising:
   a first substrate having a first surface;
   a second substrate having an outermost edge and a second surface generally orthogonal to the first surface;
   one or more dies over the first surface, wherein an outermost die of the one or more dies includes a third surface generally orthogonal to the second surface;
   a plurality of wirebonds extending from the second surface of the second substrate to at least one of (a) the first surface of the first substrate, or (b) the third surface of the outermost die; and
further comprising:
   a mold material disposed over the first substrate and at least partially covering the one or more dies and the wirebonds, wherein the mold material includes a fourth surface generally co-planar with the outermost edge of the second substrate.

8. A semiconductor package, comprising:
   a first substrate having a first surface;
   a second substrate having a second surface generally orthogonal to the first surface;
   one or more dies over the first surface, wherein an outermost die of the one or more dies includes a third surface generally orthogonal to the second surface;
   a plurality of wirebonds extending from the second surface of the second substrate to at least one of (a) the first surface of the first substrate, or (b) the third surface of the outermost die;
   a third substrate having a third surface;
   a fourth substrate having a fourth surface; and
   a fifth substrate having a fifth surface;
   wherein, the third, fourth and fifth surfaces are each generally orthogonal to the first surface.

9. The semiconductor package of claim 8 wherein the second, third, fourth and fifth substrates are attached to the first substrate via a uniform bonding material over the first surface.

10. The semiconductor package of claim 8 wherein the third, fourth and fifth substrates are attached to one another via a bonding material extending vertically along each of the third, fourth and fifth substrates.

11. The semiconductor package of claim 8 wherein the second, third, fourth and fifth substrates define an enclosure surrounding the one or more dies.

12. The semiconductor package of claim 11, further comprising a mold material within the enclosure and at least partially covering the one or more dies, first surface, second surface, third surface, fourth surface, fifth surface and wirebonds.

13. The semiconductor package of claim 8 wherein the wirebonds are first wirebonds, the package further comprising:
   a plurality of second wirebonds extending from the third surface to at least one of (a) the first surface of the first substrate, or (b) the outermost surface of the outermost die;
   a plurality of third wirebonds extending from the fourth surface to at least one of (a) the first surface of the first substrate, or (b) the outermost surface of the outermost die;

a plurality of fourth wirebonds extending from the fifth surface to at least one of (a) the first surface of the first substrate, or (b) the outermost surface of the outermost die.

14. The semiconductor package of claim 8 wherein the first, second, third, fourth and fifth substrates each include a first side facing the one or more dies and a second side generally opposite the first side and facing away from the one or more dies, wherein the second side of each of the first, second, third, fourth and fifth substrates includes an external connection site having an exposed conductive material.

\* \* \* \* \*